(12) United States Patent
Wu et al.

(10) Patent No.: US 10,686,127 B2
(45) Date of Patent: Jun. 16, 2020

(54) ANTIFERROMAGNET AND HEAVY METAL MULTILAYER MAGNETIC SYSTEMS FOR SWITCHING MAGNETIZATION USING SPIN-ORBIT TORQUE

(71) Applicant: National University of Singapore, Singapore (SG)

(72) Inventors: Yihong Wu, Singapore (SG); Yanjun Xu, Singapore (SG); Yumeng Yang, Singapore (SG)

(73) Assignee: National University of Singapore, Singapore (SG)

( * ) Notice: Subject to any disclaimer, the term of this patent is extended or adjusted under 35 U.S.C. 154(b) by 63 days.

(21) Appl. No.: 15/438,232

(22) Filed: Feb. 21, 2017

(65) Prior Publication Data

US 2017/0279038 A1    Sep. 28, 2017

(30) Foreign Application Priority Data

Mar. 28, 2016 (SG) .......................... 10201602404Q

(51) Int. Cl.
  *H01L 43/08*  (2006.01)
  *H01L 43/10*  (2006.01)
  *H01F 10/32*  (2006.01)

(52) U.S. Cl.
  CPC ......... *H01L 43/08* (2013.01); *H01F 10/3218* (2013.01); *H01L 43/10* (2013.01)

(58) Field of Classification Search
  CPC ....... H01L 43/08; H01L 43/10; H01L 27/222; H01L 43/12; H01F 10/3218; H01F 10/329

USPC ........................................................ 257/421
See application file for complete search history.

(56) References Cited

U.S. PATENT DOCUMENTS

| 8,546,896 | B2 | 10/2013 | Lottis et al. | |
|---|---|---|---|---|
| 9,218,864 | B1 | 12/2015 | Yi et al. | |
| 2005/0024788 | A1* | 2/2005 | Sato | G11B 5/127 360/324 |
| 2012/0228683 | A1* | 9/2012 | Oikawa | H01L 29/66984 257/295 |
| 2014/0125332 | A1 | 5/2014 | Lage et al. | |
| 2014/0346518 | A1 | 11/2014 | Kariyada et al. | |
| 2015/0115379 | A1 | 4/2015 | Lim et al. | |
| 2015/0129995 | A1 | 5/2015 | Wang et al. | |
| 2015/0200003 | A1* | 7/2015 | Buhrman | G11C 11/18 365/158 |
| 2015/0255135 | A1* | 9/2015 | Tran | G11C 11/161 365/158 |
| 2015/0311431 | A1* | 10/2015 | Zhou | G11C 11/161 257/421 |

(Continued)

OTHER PUBLICATIONS

Kamzin et al "Magnetic Anisotropy of Multilayer [Fe/Pt]n Structures" Technical Physics vol. 59, pp. 452-455, 2014.

(Continued)

*Primary Examiner* — Duy T Nguyen
(74) *Attorney, Agent, or Firm* — Cesari & McKenna, LLP

(57) ABSTRACT

A magnetic system containing a plurality of stacked layer arrays, each of which includes a first anti-ferromagnetic (AFM1) layer, a heavy metal (HM) layer formed of a material having strong spin-orbit coupling, and, optionally, a ferromagnetic (FM) layer or a second anti-ferromagnetic (AFM2) layer. Also disclosed is a method of preparing such a magnetic system.

10 Claims, 8 Drawing Sheets

(a)
1: Layer array of AFM1/HM
2: HM
3: AFM1
4: Substrate
5: Number of repeating period (b)
2: HM
3: AFM1
4: Substrate
5: Number of repeating period
6: Layer array of AFM1/HM/FM
7: FM (c)
2: HM
3: AFM1
4: Substrate
5: Number of repeating period
8: Layer array of AFM1/HM/AFM2
9: AFM2

(56) References Cited

U.S. PATENT DOCUMENTS

2015/0311901 A1* 10/2015 Bromberg .............. H01L 43/08
                                                    326/38
2016/0163965 A1*  6/2016 Han ....................... H01L 43/08
                                                    257/467
2016/0359102 A1* 12/2016 Hong ..................... H01L 43/08
2017/0117323 A1*  4/2017 Braganca ............... H01L 43/10

OTHER PUBLICATIONS

Lim et al "Effect of Different Seed Layers with Varying Co and Pt Thicknesses on the Magnetic Properties of Co/Pt Multilayers" Journal of Applied Physics vol. 117, 2015.
Zhang et al "Investigation on the Microstructure and Magnetic Properties of FePt Films Prepared by Sequentially Sputtering" Materials Letters vol. 79, pp. 235-237, 2012.

* cited by examiner (a)

1: Layer array of AFM1/HM
2: HM
3: AFM1
4: Substrate
5: Number of repeating period (b)

2: HM
3: AFM1
4: Substrate
5: Number of repeating period
6: Layer array of AFM1/HM/FM
7: FM (c)

2: HM
3: AFM1
4: Substrate
5: Number of repeating period
8: Layer array of AFM1/HM/AFM2
9: AFM2

ANTIFERROMAGNET AND HEAVY METAL MULTILAYER MAGNETIC SYSTEMS FOR SWITCHING MAGNETIZATION USING SPIN-ORBIT TORQUE

CROSS-REFERENCE TO RELATED APPLICATIONS

This application claims the benefit of priority of Singaporean Patent Application No. 10201602404Q, filed Mar. 28, 2016, the content of which is being incorporated by reference in its entirety for all purposes.

BACKGROUND

Magnetic memories, e.g., magnetic random access memories (MRAMs), have drawn increasing attention in nonvolatile memory applications due to their properties of high read-write speed, excellent endurance, and low power consumption.

A typical MRAM system contains two ferromagnetic (FM) layers separated by an ultrathin insulator, i.e., a magnetic tunnel junction. The magnetization of one FM layer, a pinned or reference layer, is pinned by an anti-ferromagnetic (AFM) layer, whereas the magnetization of the other FM layer, i.e., the free layer, is relatively free to rotate. The relative direction of the two FM layers is used to store information.

Traditionally, magnetization switching of the free layer is accomplished by applying an external field of appropriate direction and strength. This process has a drawback of inapplicability for downscaling and low-power operation.

Spin transfer torque (STT) has been used in MRAMs for improving their magnetization capability. Yet, STT-MRAM has drawbacks such as requiring high current density and same current for both write and read. The latter makes it difficult to optimize the cell design for both write and read operations.

Recently, extensive efforts have been devoted to the study of spin-orbit torque (SOT), which is based on spin-orbit coupling, in bilayer magnetic systems, e.g., ferromagnetic metal/heavy metal (FM/HM) bilayers. Despite the capability of switching the magnetization of a thin FM layer, use of SOT in FM/HM bilayers faces a significant challenge for downscaling when applied in magnetic memories due to the poor thermal stability of the thin layer. Another drawback of this application resides in the requirement of high current density and an assistant field.

There is a need to develop a new magnetic system that is capable of switching magnetization without the above-described drawbacks.

SUMMARY

An aspect of the present intention is a magnetic system that unexpectedly exerts capability of switching magnetization with its own current in the absence of any external field.

The magnetic system contains a plurality of stacked layer arrays, each of which includes a first anti-ferromagnetic (AFM1) layer, a heavy metal (HM) layer formed of a material having strong spin-orbit coupling, and, optionally, a ferromagnetic (FM) layer or a second anti-ferromagnetic (AFM2) layer. The magnetic system exhibits ferromagnetic property above room temperature and spin-orbit torque (SOT) in the presence of an in-plane current, the SOT capable of switching magnetization of the system in the absence of an external magnetic field.

Typically, the magnetic system also contains a capping layer, a seed layer, or both, in which the capping layer and the seed layer are respectively disposed at the top and the bottom of the plurality of layer arrays.

In one embodiment of the magnetic system, each layer array contains only two layers, i.e., an AFM1 layer and an HM layer.

In another embodiment, the magnetic system contains multiple layer arrays, in which each layer array contains only three layers, i.e., an AFM1 layer, an HM layer, and an FM layer; and the top-to-bottom order of the three layers disposed directly on each other is AFM1-HM-FM or FM-HM-AFM1.

In a further embodiment of the magnetic system, each layer array contains only an AFM1 layer, an HM layer, and an AFM2 layer; and the top-to-bottom order of these three layers disposed directly on each other is AFM1-HM-AFM2 or AFM2-HM-AFM1.

Another aspect of this invention is a method of preparing the magnetic system described above. The method includes the following steps: providing an AFM1 layer; placing directly an HM layer on the AFM1 layer, the HM layer formed of a material having strong spin-orbit coupling; optionally, depositing an FM layer or an AFM2 layer on the HM layer to form a layer array; and, finally, stacking the layer array thus formed and a plurality of identical layer arrays to obtain a magnetic system.

The magnetic system thus prepared is capable of switching magnetization, in the absence of any external field, by the SOT generated in the presence of an in-plane current. The magnetization can be oriented in plane or out of plane.

The details of the invention are set forth in the description below. Other features, objects, and advantages of the invention will be apparent from the following drawing and detailed description of several embodiments, and also from the appending claims.

DETAILED DESCRIPTION

Figure 1:
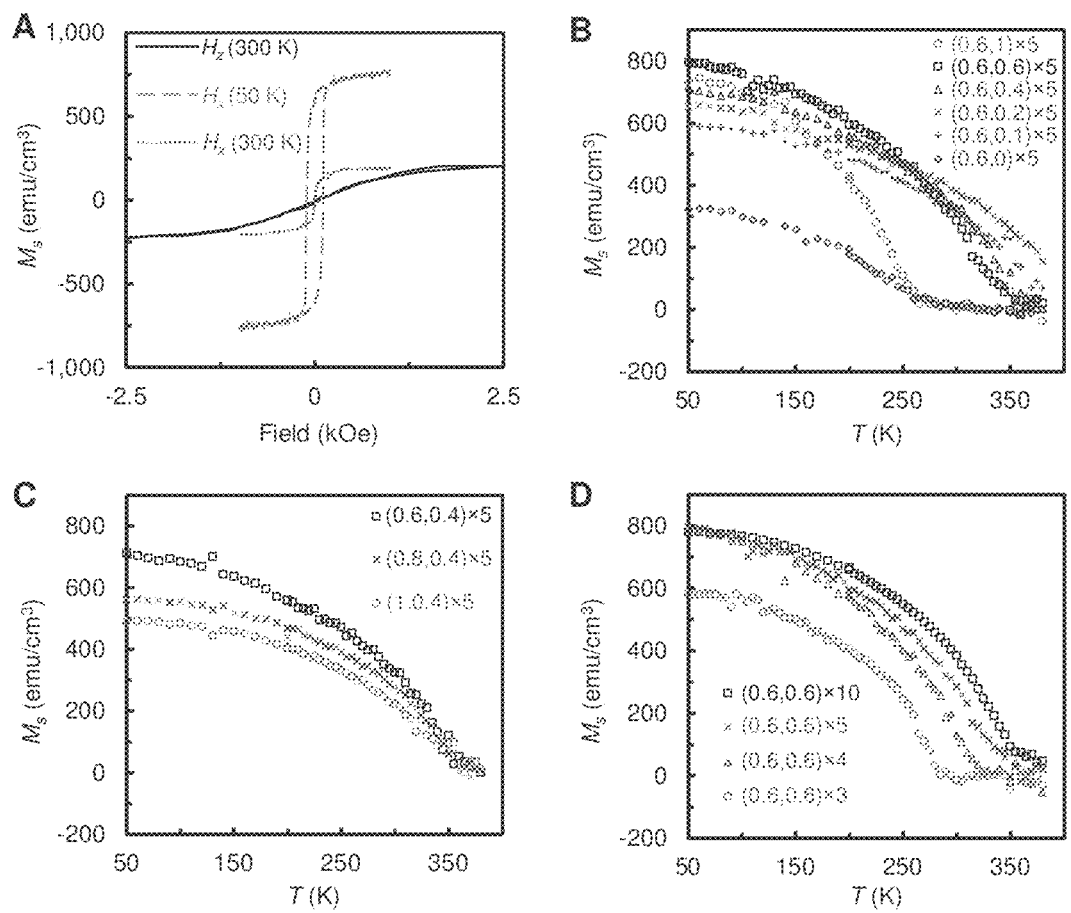
FIGS. 1A to 1D are a schematic depiction of magnetic properties. 1A: Hysteresis loops of Pt(3)/[FeMn(0.6)/Pt(0.6)]$_5$, measured at 50 K (dashed line in green) and 300 K (dotted line in red) with an in-plane field and at 300 K (black solid curve) with an out-of-plane field. 1B to 1D: Saturation magnetization of Batch A samples (see Table 1 below) as a function of temperature (M-T curve). The legend $(t_1, t_2) \times n$ in 1B to 1D denotes a FeMn thickness of $t_1$ and a Pt thickness of $t_2$ in each layer array, and a period of n as the number of layer arrays.

Disclosed first in detail herein is a magnetic system that is capable of switching magnetization without applying an external field.

Inverse spin galvanic effect (ISGE) has been exploited to manipulate magnetization of ferromagnetic materials with either bulk or structure inversion asymmetry (SIA) (1-7). In these material structures, a charge current passing through a ferromagnet (2, 3, 8) or a FM/HM heterostructure (4, 9-15) generates a non-equilibrium spin density through the ISGE, which in turn exerts a torque on the local magnetization of the FM through either s-d (in the case of a transition metal) or p-d (in the case of dilute magnetic semiconductor) exchange coupling. As the ISGE is originated from spin-orbit coupling (SOC), the resultant torque is referred to as spin-orbit torque (SOT). Unlike spin transfer torque (STT), which requires non-collinear magnetization configurations, the SOT can be realized in structures with a uniform magnetization. This greatly simplifies the structure and device design when investigating and exploiting the SOT effect for spintronic applications.

Although SOC induced spin polarization of electrons has been studied extensively in semiconductors (16-18), the investigations of SOC induced non-equilibrium spin density in ferromagnets and the resultant SOT on local magnetization have only been reported recently. Manchon and Zhang (2) reported that, in the presence of a Rashba spin-orbit coupling, the SOT is able to switch the magnetization of magnetic two-dimensional electron gas at a current density of about $10^4$-$10^6$ A/cm$^2$, which is lower than or comparable to the critical current density of typical STT samples. The first experimental observation of SOT was reported by Chernyshov et al. (3) for Ga$_{0.94}$Mn$_{0.06}$As dilute magnetic semiconductor (DMS) grown epitaxially on GaAs (001) substrate. The compressive strain due to lattice mismatch results in a Dresselhaus-type spin-orbit interaction that is linear in momentum. When a charge current passes through the DMS layer below its Curie temperature, 80K in this case, the resulting SOT is able to switch the magnetization with the assistance of an external field and crystalline anisotropy. The lack of bulk inversion asymmetry (BIA) in transition metal FM has prompted researchers to explore the SOT effect in FM heterostructures with SIA. Miron et al. (4) reported the first observation of a current-induced SOT in a thin Co layer sandwiched by a Pt and an AlO$_x$ layer. Due to the asymmetric interfaces with Pt and AlO$_x$, electrons in the Co layer experience a large Rashba effect, leading to sizable current-induced SOT. In addition to the Rashba SOT, spin current from the Pt layer due to spin Hall effect (SHE) also exerts a torque on the FM layer through transferring the spin angular momentum to the local magnetization. To differentiate it from the Rashba SOT, it is also called SHE-SOT. Although the exact mechanism still remains debatable, both types of torques are generally present in the FM/HM bilayers. The former is field-like, while the latter is of anti-damping nature similar to STT. Mathematically, the two types of torques can be modeled by $\vec{T}_{FL}=\tau_{FL}\vec{m}\times(\vec{j}\times\vec{z})$ (field-like) and $\vec{T}_{DL}=\tau_{DL}\vec{m}\times[\vec{m}\times(\vec{j}\times\vec{z})]$ (anti-damping like), respectively, where $\vec{m}$ is the magnetization direction, $\vec{j}$ is the in-plane current density, $\vec{z}$ is the interface normal, $\tau_{FL}$ and $\tau_{DL}$ are the magnitudes of the field-like and anti-damping like torques, respectively (5, 7). To date, the SOT effect has been reported in several FM/HM bilayers with different FMs such as CoFeB (11, 15, 19-23), Co (4, 10, 24-26), NiFe (12, 27, 28) and HMs such as Pt (27, 29-31), Ta (9, 11, 19-21), and W (22). An average effective field strength of $4\times10^{-6}$ Oe/(A/cm$^2$) has been obtained, except for the [Pd/Co]$_n$/Ta multilayer (32) which was reported to exhibit a very large effective field strength to current density ratio in the range of $10^{-5}$ Oe/(A/cm$^2$). In the latter case, the spin Hall current from Ta layer alone is unable to account for the large effective field, indicating possible contributions arising from the Pd/Co interfaces internally, though the exact mechanism is not clear. Despite these efforts, however, so far SOT-induced magnetization switching has only be realized in FM/HM structures with ultrathin FM layers.

A magnetic system of this invention contains a plurality of stacked layer arrays, each of which includes a first antiferromagnetic (AFM1) layer, a heavy metal (HM) layer formed of a material having strong spin-orbit coupling, and, optionally, a ferromagnetic (FM) layer or a second antiferromagnetic (AFM2) layer.

Each of the AFM1 layer and the AFM2 layer, being different from each other, can be formed of FeMn, IrMn, PtMn, NiMn, PtNiMn, NiO, CoO, NiFe, Mn, or Cr.

The HM layer is formed a material having strong spin-orbit coupling, which typically has a spin Hall angle of between 0.05 and 1.0. Examples of the material include, but are not limited to, Pt, Pd, Ta, and W.

On the other hand, the FM layer can be formed of Co, Fe, Ni, Gd, CoFeB, or an alloy thereof.

Each of the AFM1 layer, the AFM2 layer, and the FM layer typically has a thickness of 0.1 to 1.0 nm (e.g., 0.2 to 1.0 nm and 0.4 to 1.0 nm). The HM layer can have a thickness of 0.1 to 1.2 nm (e.g., 0.2 to 0.8 nm and 0.4 to 0.8 nm).

Figure 6:
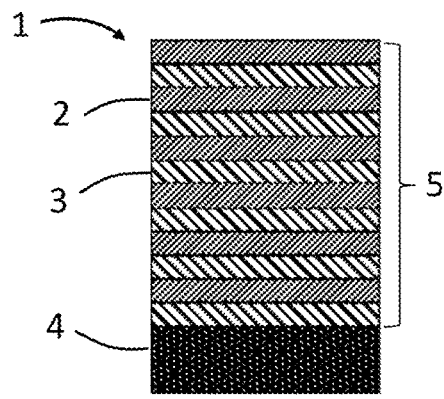
FIGS. 6A-6C are each a schematic depiction of an exemplary magnetic system. 6A: A magnetic system that includes six layer arrays in a stacked arrangement on a substrate, each layer array containing a first antiferromagnetic (AFM1) layer and a heavy metal (HM) layer. 6B: A magnetic system that includes four layer arrays in a stacked arrangement on a substrate, each layer array containing an AFM1 layer, an HM layer, and a ferromagnetic (FM) layer, in which the top-to-bottom order of the three layers is AFM1-HM-FM. 6C: A magnetic system that includes four layer arrays in a stacked arrangement on a substrate, each layer array containing an AFM1 layer, an HM layer, and a second antiferromagnetic (AFM2) layer, in which the top-to-bottom order of the three layers is AFM1-HM-AFM2.
Figure 6:
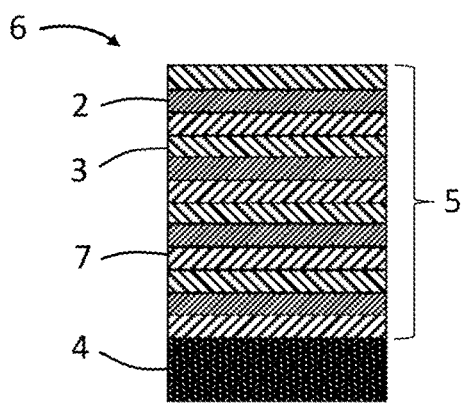
Figure 6:
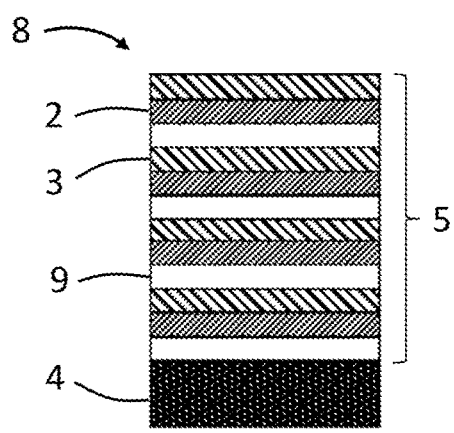

An exemplary magnetic system contains in each layer array only an AFM1 layer and an HM layer (FIG. 6A). It features that the AFM1 layer, having a thickness of 0.2 to 1.0 nm, is formed of FeMn or NiFe; and the HM layer, having a thickness of 0.2 to 0.8 nm, is formed of Pt.

Another exemplary magnetic system contains in each layer array only an AFM1 layer, an HM layer, and an FM layer (FIG. 6B). It features that the AFM1 layer, having a thickness of 0.2 to 1.0 nm, is formed of FeMn or NiFe; the HM layer, having a thickness of 0.2 to 0.8 nm, is formed of Pt or Pd; and the FM layer, having a thickness of 0.2 to 1.0 nm, is formed of Co or Ni.

A still another exemplary magnetic system contains in each layer array only an AFM1 layer, an HM layer, and an AFM2 layer (FIG. 6C). It features that the AFM1 layer and the AFM2 layer, being different from each other and each having a thickness of 0.2 to 1.0 nm, are independently formed of FeMn, IrMn, PtMn, NiMn, PtNiMn, NiO, CoO, NiFe, Mn, or Cr; and the HM layer, having a thickness of 0.2 to 0.8 nm, is formed of Pt or Pd.

Figure 8:
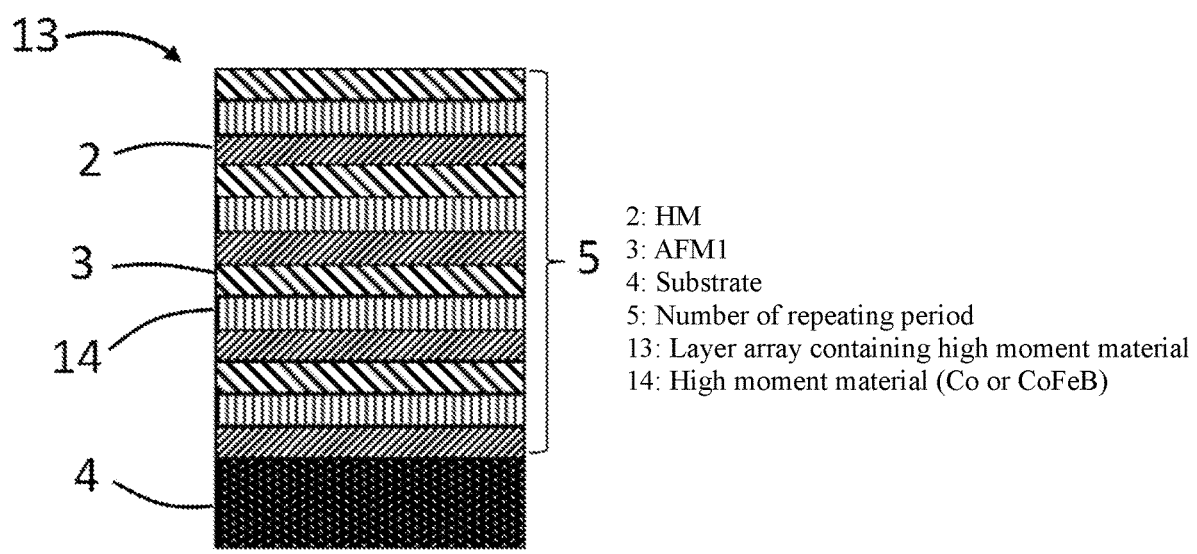
FIG. 8 is a schematic depiction of an exemplary magnetic system that includes four layer arrays in a stacked arrangement, each of the layer arrays containing an AFM1 layer, an HM layer, and a layer formed of a high moment material, e.g., Co or CoFeB.

The magnetic system of this invention can also include a plurality of layer arrays, each of which further contains a layer formed of a high moment material, e.g., Co or CoFeB (FIG. 8).

Figure 7:
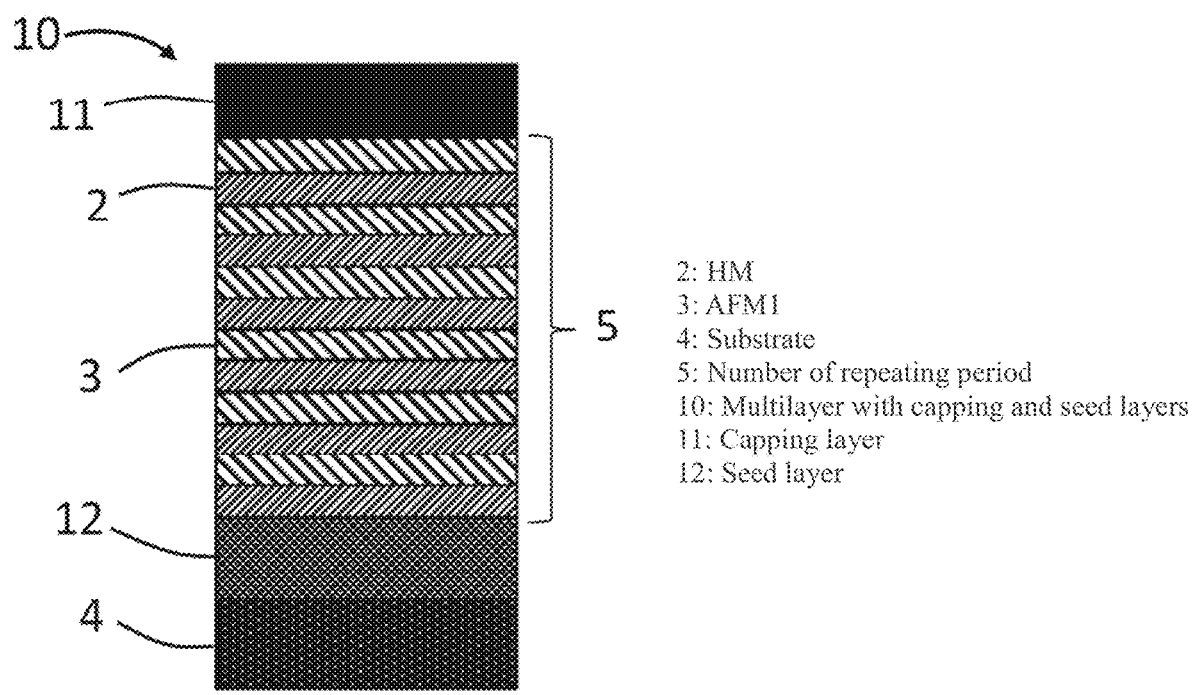
FIG. 7 is a schematic depiction of an exemplary magnetic system that includes six layer arrays in a stacked arrangement, a capping layer disposed on top of the six layer arrays, and a seed layer disposed at the bottom of the six layer arrays. Each of the layer arrays contains an AFM1 layer and an HM layer.

Again, the magnetic system typically contains a capping layer, a seed layer, or both, in which the capping layer and the seed layer are respectively disposed at the top and the bottom of the plurality of layer arrays (FIG. 7). Further, the capping layer and the seed layer can each be formed of a material having strong spin-orbit coupling, the material being Pt, Ta, W, Ir, Pb, Se, Te, Bi, Sb, Hf, PtPb, or a topological insulator.

Also within the scope of this invention is a method for preparing the magnetic system described above. The method includes the following steps: (i) providing an AFM1 layer; (ii) placing directly an HM layer on the AFM1 layer, the HM layer formed of a material having strong spin-orbit coupling; optionally, (iii) depositing an FM layer or an AFM2 layer on the HM layer to form a layer array; and (iv) stacking the layer array thus formed and a plurality of identical layer arrays to obtain a magnetic system.

An exemplary magnetic system is fabricated by the above method based on [Pt/FeMn]$_n$ (n can be 3, 4, 5, or 6) layer arrays or multilayers. By controlling the thicknesses the Pt layer and the FeMn layer, it is possible to achieve both ferromagnetic properties and SOT effect in [Pt(t$_1$)/FeMn (t$_2$)]$_n$ layer arrays above room temperature, with t$_1$ and t$_2$ in the range of 0.4 to 0.8 nm and 0.2 to 1 nm, respectively. The magnetization of [Pt/FeMn]$_n$ layer arrays can be reversibly switched by the current-induced SOT with or without an additional Pt layer. The current density for inducing magnetization switching in a standalone multilayer (i.e., without an additional Pt layer) with a total thickness of 5 nm is close to the order of 10$^6$ A/cm$^2$, which is much lower than other HM/FM bilayers with similar FM thicknesses.

It has been reported that a SOT effect was observed in FeMn/Pt bilayers (33) and a proximity effect was observed at the FeMn/Pt interfaces (34). The present invention demonstrates that, by controlling the Pt and FeMn layer thicknesses, it is feasible to achieve both ferromagnetic properties and SOT effect in [FeMn(t$_1$)/Pt(t$_2$)]$_n$ layer arrays above room temperature, with t$_1$ and t$_2$ in the range of 0.1 to 1.0 nm (e.g., 0.2 to 1.0 nm and 0.4 to 1.0 nm) and 0.1 to 1.2 nm (e.g., 0.2 to 0.8 nm and 0.4 to 0.8 nm), respectively. The ratio of field-like effective field (H$_{FL}$) to current density (j$_{mul}$) in standalone [FeMn/Pt]$_n$ multiple layers is about 1×10$^{-6}$ Oe/(A/cm$^2$), which is comparable to those observed in Pt/Co/AlO$_x$ trilayers (19, 31). The addition of a thick Pt layer either at the top or bottom helps increase H$_{FL}$/j$_{mul}$ to a certain extent but within the same order. It is also demonstrated that the magnetization of [FeMn/Pt]$_n$ layer arrays can be reversibly switched by the current-induced SOT with or without an additional Pt layer. The current density for inducing magnetization switching in a standalone multilayer with a total thickness of 8.2 nm is around 7×10$^5$ A/cm$^2$, which is much lower than that of HM/FM bilayers with similar FM thicknesses (30, 31). The realization of self-current induced magnetization switching in these standalone and thick magnetic layers will open new possibilities for practical applications of SOT-based samples.

The present invention further demonstrates that, by stacking ultrathin Pt and FeMn alternately, both ferromagnetic properties and current induced spin-orbit torque can be achieved in FeMn/Pt layer arrays without any constraint on its total thickness. The critical behavior of these layer arrays follows closely three-dimensional Heisenberg model with a finite Curie temperature distribution. The spin torque effective field is about 4 times larger than that of NiFe/Pt bilayer with a same equivalent NiFe thickness. The self-current generated spin torque is able to switch the magnetization reversibly without the need for an external field or a thick heavy metal layer. The removal of both thickness constraint and necessity of using an adjacent heavy metal layer open new possibilities for exploiting spin-orbit torque for practical applications.

Without further elaboration, it is believed that one skilled in the art can, based on the above description, utilize the present invention to its fullest extent. The following specific examples are, therefore, to be construed as merely illustrative, and not limitative of the remainder of the disclosure in any way whatsoever. The publications cited herein are incorporated by reference in their entirety.

Example 1: Synthesis of Pt/FeMn Layer Arrays and Characterization of Magnetic Properties A magnetic system containing Pt/FeMn multiple layer arrays is synthesized and characterized as follows.

The FeMn/Pt layer arrays containing alternate and ultrathin FeMn and Pt layers were deposited on SiO$_2$/Si substrates using DC magnetron sputtering with a base and working pressure of 2×10$^{-8}$ Torr and 3×10$^{-3}$ Torr, respectively. An in-plane field of about 500 Oe was applied during the sputtering deposition to induce a uniaxial anisotropy. The basic structural and magnetic properties of the layer arrays were characterized using X-ray diffraction (XRD), X-ray photoelectron spectroscopy, and vibrating sample magnetometer (VSM), on coupon films. The XRD measurements were performed on D8-Advance Bruker system with Cu $K_\alpha$ radiation. Magnetic measurements were carried out using a Quantum Design VSM with the samples cut into a size of 2.5 mm×2 mm. The resolution of the system is better than $6 \times 10^{-7}$ emu.

Hall bar samples or Hall bars, with a central area of 2.3 mm×0.2 mm and transverse electrodes of 0.1 mm×0.02 mm, were fabricated using combined techniques of photolithography and sputtering deposition. All electrical measurements (unless specified otherwise) were carried out at room temperature using the Keithley 6221 current source and 2182 A nanovoltmeter. The PHE measurements were performed by supplying a DC bias current (I) to the Hall bar and measuring the Hall voltage ($V_{xy}$) while sweeping an external field (H) in x-axis direction. Current sweeping measurements were carried out using pulsed current without any external field.

Shown in Table 1 below are samples of Batches A, B, and C, which were prepared based on the methods described above, in which n=3, 4, 5, or 6.

TABLE 1

| Structures of Batches A, B, and C samples | |
| --- | --- |
| Batch | Structure |
| A | Pt(3)/[FeMn($t_1$)/Pt($t_2$)]$_n$/SiO$_2$/Si |
| B | Pt(3)/[FeMn(0.6)/Pt(0.6)]$_n$/Ta(3)/SiO$_2$/Si |
| C | Pt(1)/[FeMn(0.6)/Pt(0.6)]$_4$/SiO$_2$/Si |

A series of Hall bar samples, i.e., Batch B samples in Table 1, with a dimension of 2.3 mm (length)×0.2 mm (width) were fabricated using the combined sputtering and liftoff techniques for electrical characterization. This batch of Hall bar samples had a structure of Pt(3)/[FeMn(0.6)/Pt(0.6)]$_n$/Ta(3)/SiO$_2$/Si, where n=3, 4, 5 and 6. The number inside the parentheses denotes the thickness of individual layers in nm. The Batch C sample, also in the Hall bar form with the same dimension was fabricated to evaluate the SOT effect in standalone Pt(1)/[FeMn(0.6)/Pt(0.6)]$_4$/SiO$_2$/Si layer arrays without an additional Pt layer except for a 1 nm-thick Pt capping layer for protecting the sample from oxidation. The Hall bar samples were wire bonded to chip carriers for electrical measurements, which were all performed at ambient condition using Keithley current source and nanovoltmeters. For both magnetoresistance (MR) and Hall measurements, a DC current was applied in the longitudinal direction which is also the easy axis direction induced by a magnetic field during the deposition. The nano-voltmeter was used to measure both the longitudinal and transverse voltage for MR and Hall measurements, respectively. A sweeping external magnetic field could be applied in all directions, i.e., longitudinal (x), transverse (y), and vertical (z), based on the measurement requirements.

The magnetic properties of Pt(3)/[FeMn($t_1$)/Pt($t_2$)]$_n$/SiO$_2$/Si (Batch A) samples with different layer thicknesses and period were characterized using a Quantum Design VSM by cutting the thin film samples into a size of 2.5 mm×2 mm. Here the number and symbols inside the parentheses denote the thickness of individual Pt and FeMn layers in nm, and n is the number of period or layer arrays. The sample sequence starts from the most top layer to the substrate unless otherwise specified. To facilitate the comparison with electrical measurement results, n was fixed to be 5 (unless specified otherwise) and $t_1$ and $t_2$ were varied systematically to investigate how the magnetic properties depend on the individual layer thickness.

All the layer arrays were found to exhibit in-plane anisotropy. FIG. 1A shows a typical example of in-plane and out-of-plane hysteresis loops for the sample with $t_1=t_2=0.6$ nm, measured at 50 K and 300 K, respectively. For this sample, the coercivity ($H_c$) decreased from 108 Oe at 50 K to about 1 Oe at 300 K, with a saturation magnetization ($M_s$) of 286.8 emu/cm$^3$ at 300 K. Both the low $M_s$ and $H_c$ values facilitated SOT-induced magnetization switching with a low current. FIGS. 1B to 1D shows the saturation magnetization of Pt(3)/[FeMn($t_1$)/Pt($t_2$)]$_n$ layer arrays as a function of temperature (the M-T curves), with the legend denoting ($t_1$, $t_2$)×n. The M-T curves were obtained by first cooling the sample from 300 K to 50 K and then recording the magnetic moment while warming up the sample from 50 K to 380 K with an applied in-plane field of 1000 Oe. The field applied was sufficient to saturate the magnetization in the field direction. With the measurements were performed at above 50 K by the VSM, it was confirmed that, when using a separate system for the (0.6, 0.6)×5 sample, the magnetization measured at below 50 K was nearly constant between 10 K and 50 K.

FIG. 1B shows the M-T curves of samples with $t_1=0.6$ nm, n=5, and $t_2=0$, 0.1, 0.2, 0.4, 0.6, and 1 nm. In the range of $t_2=0.1$ nm-0.6 nm, the saturation magnetization at 50 K gradually increased with $t_1$ from about 587.9 to 795.4 emu/cm$^3$, while the Curie temperature ($T_C$) fell in the range of 350 K-420 K, which varied non-monotonically with $t_2$.

On the other hand, $T_C$ dropped sharply to about 260 K for both the $t_2=0$ and $t_2=1$ nm samples. The former was essentially a FeMn(3)/Pt(3) bilayer. Both spin canting and magnetic proximity effect could contribute to the sizable $M_s$ for the $t_2=0$ sample below 260 K. The former resulted from softening of FeMn spin sublattices at small thickness and the latter was due to the fact that Pt is at the Stoner threshold to become a FM, which could be polarized easily when contacting with a ferromagnet (35-39). Control experiments using a FeMn(3)/Au(3) sample revealed that, although proximity effect was indeed present in FeMn(3)/Pt(3) bilayer, its contribution to magnetic moment was small and the measured moment was from canting of the FeMn spin sublattices. Despite its small contribution to the magnetic moment, the Pt layer played an important role in promoting ferromagnetic ordering throughout the layer arrays when the Pt thickness was below 0.6 nm. In this thickness range, the proximity effect from both sides of Pt could couple with each other, leading to global FM ordering in the multilayer. When $t_2$ was increased further to 1.0 nm and beyond, the central regions of the individual Pt layers remained un-polarized, hindering ferromagnetic ordering throughout the multilayer. This explained why $T_C$ of the $t_2=1$ nm sample dropped back to the same level of FeMn(3)/Pt(3), yet its magnetization was much larger than that of the latter due both increased number of interfaces and further softening of the FeMn layers.

FIG. 1C shows the $t_1$-dependence of magnetic properties by evaluating the M-T curves of samples with $t_2=0.4$ nm, n=5, and $t_1=0.6$, 0.8, and 1 nm. It was observed that the $M_s$ at low temperature decreased with increasing $t_1$, but $T_C$ remained almost the same. This suggests that FM ordering weakened when the thickness of FeMn increased. Unlike the case of increasing $t_2$, the increase of $t_1$ up to 1.0 nm did not lead to a sharp decrease of $T_C$. In other words, the $T_C$ was mainly determined by the degree of polarization of the Pt layer.

FIG. 1D shows the effect of the total thickness on magnetic properties. The decrease of n led to gradual decreases of both $M_s$ and $T_C$. Both the surface and size effects could contribute to the observed decreases. The multilayer is sandwiched between thin Pt layers at both the top and bottom. When n is small, the less polarized top and bottom Pt layer could affect the magnetic properties of the multilayer, leading to reductions of both $M_s$ and $T_C$. The $T_C$ of a ferromagnetic thin film could be determined by scaling analysis, i.e., $T_C(\infty)-T_C(d) \propto d^{-1/\nu}$, where $T_C(\infty)$ and $T_C(d)$ are the Curie temperature of bulk and thin film with a thickness d, respectively, and v is the critical exponent of the bulk correlation length in the range of 0.5 to 0.705 (40, 41). Fitting of data to this equation gave a v value of 1.6, which is much larger than values obtained for Ni (v=1) and Gd (v=0.625) thin films (41). This could result from the finite distribution of $T_C$ itself in the layer arrays.

The M-T curve of a ferromagnet generally follows the semi-empirical formula (42) shown below:

$$M(T) = M(0)\left[1 - s\left(\frac{T}{T_c}\right)^{3/2} - 1(1-s)\left(\frac{T}{T_c}\right)^{5/2}\right]^\beta \quad (1)$$

where M(0) is the magnetization at zero temperature, $T_C$ is the Curie temperature, β is the critical exponent representing the universality class that the material belongs to, and s is a fitting constant.

The M-T curves could be fitted reasonably well using formula (1) above except the β values of 0.68-0.9, which are 2-3 times larger than that of bulk ferromagnet. The fitting result was sensitive to β. Put differently, the large β value was a characteristic of the multilayer sample. Although a large value in the range of 0.7-0.89 is typically obtained for surface magnetism (43-46), the layer arrays here were different from surface magnetism due to their relatively large thickness. As shown in FIGS. 1A to 1D, $T_C$ of the layer arrays was dependent on the individual thickness. Thus, it is plausible that there was a finite distribution of $T_C$ inside the multilayer due to thickness fluctuation induced by the interface roughness.

Further, it was observed that the M-T curves could be fitted very well, especially in the high-temperature region, by assuming a normal distribution of $T_C$ and using β=0.365 for all the samples (note that β=0.365 is the critical exponent for M-T based on three-dimensional (3D) Heisenberg model). The width of $T_C$ distribution was found to agree very well with the range of $T_C$ observed in FIGS. 1A to 1D for different samples.

These analyses revealed that FeMn/Pt layer arrays are 3D ferromagnets with a finite $T_C$ distribution.

Example 2: Evaluation of Magnetoresistance and Hall Resistance

Studies were performed to evaluate the magnetoresistance and Hall resistance of the samples prepared in EXAMPLE 1 as follows.

Figure 2:
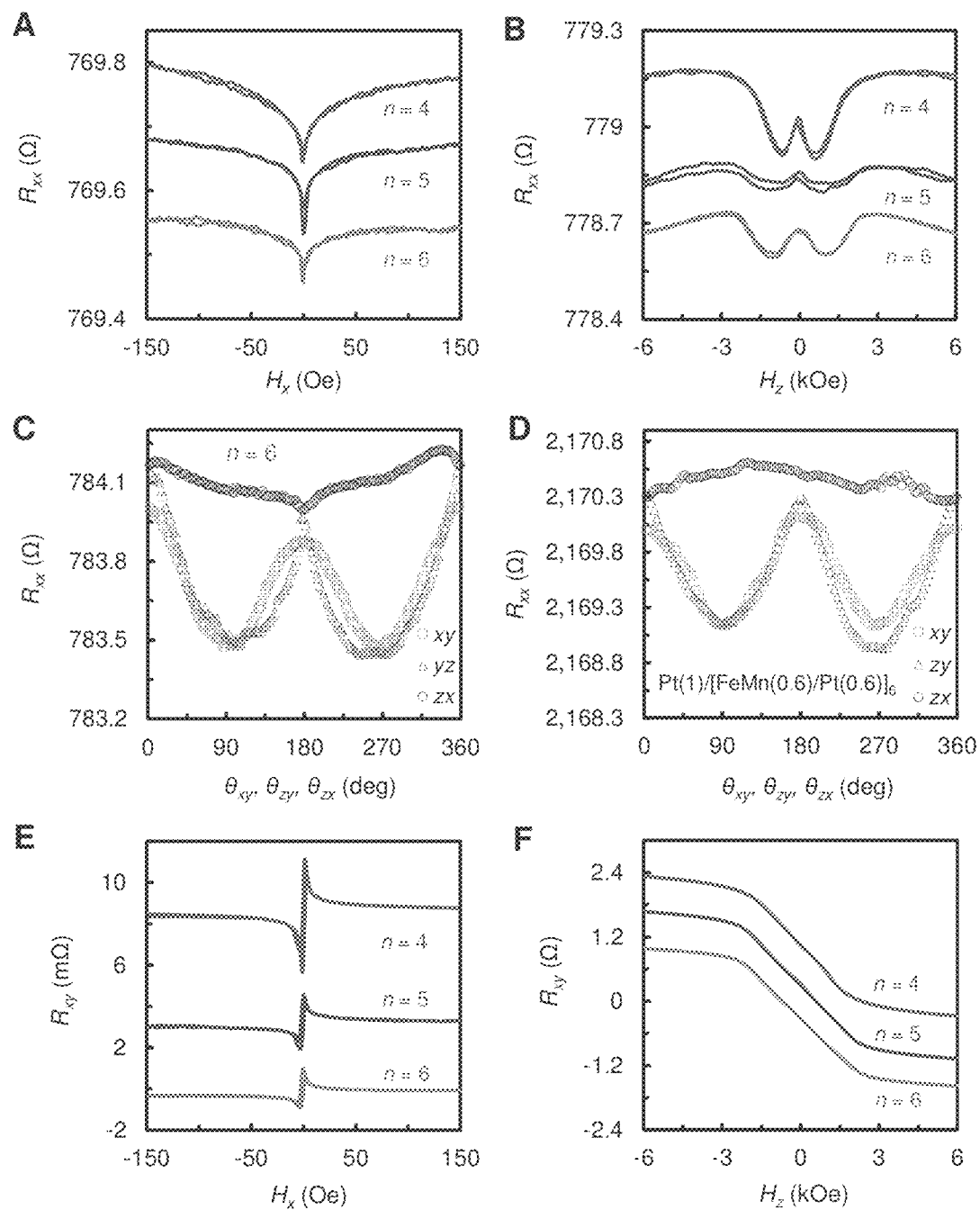
FIGS. 2A to 2F are a schematic depiction of magnetoresistance and Hall resistance of Batch B samples (also see Table 1 below). 2A and 2B: Magnetoresistance of samples with n=4, 5, and 6, measured by sweeping the field in a longitudinal direction 2A and a vertical direction 2B at a bias current of 1 mA. 2C and 2D: Angular dependence of magnetoresistance for the sample with n=6 2C and the sample Pt(1)/[FeMn(0.6)/Pt(0.6)]$_6$/SiO$_2$/Si 2D, measured by rotating the sample in xy, zy and zx planes with a constant longitudinal field of 3000 Oe. 2E and 2F: planar Hall resistance (PHR) and anomalous Hall resistance measured by sweeping the field in a longitudinal direction 2E and a vertical direction 2F at a bias current of 1 mA for the same set of samples whose MR curves are shown in FIGS. 2A and 2B. Note that all but the n=6 curve in FIGS. 2A, 2B, 2E, and 2F are vertically shifted for clarity. The zero-field resistances for samples with n=4, 5, and 6 are 912.6, 871.3, and 769.5Ω, respectively.

FIGS. 2A and 2B show the room temperature magnetoresistance (MR) of four Hall bar samples with structure Pt(3)/[Pt(0.6)/FeMn(0.6)]$_n$/Ta(3)/SiO$_2$/Si (i.e., Batch B samples) with n=4, 5, and 6, measured by sweeping the field in a longitudinal direction (FIG. 2A) and a vertical direction (FIG. 2B), respectively, at a bias current of 1 mA. All these samples had a Pt(3) (indicium of a 3 nm Pt layer) capping layer and a Ta(3) (indicium of a 3 nm Ta layer) seed layer. The longitudinal MR of all these samples shows a negative peak at low field with negligible coercivity. The amplitude of the peak remained almost constant while the coercivity increased as temperature decreased. The transverse MR shows a positive peak at low field. In contrast to the single peak of longitudinal and transverse MR, the out-of-plane MR shows a characteristic "W" shape below the saturation field (FIG. 2B), which could not be explained by the conventional anisotropic magnetoresistance (AMR) behavior alone. In order to reveal its origin, angular dependence measurement was performed by rotating a constant field of 3000 Oe relative to samples on different planes. The results are shown in FIGS. 2C and 2D for the n=6 sample and the sample with the structure of Pt(1)/[FeMn(0.6)/Pt(0.6)]$_6$, respectively. In the figures, $\theta_{xy}$, $\theta_{zy}$, and $\theta_{zx}$ are the angles of field with respect to the x, z, and z axis, when the samples were rotated in the xy-, zy-, and zx-plane, respectively. The results shown in FIGS. 2C and 2D suggest that both AMR, $\rho=\rho_0+\Delta\rho_{AMR}(\vec{m}\cdot\vec{j})^2$, and unconventional MR (UCMR), $\rho=\rho_0+\Delta\rho_{UCMR}[\vec{m}\cdot(\vec{z}\times\vec{j})]^2$, were present in the multilayer samples. Here, $\vec{m}$ and $\vec{j}$ are unit vectors in the directions of the magnetization and the current, respectively, $\vec{z}$ represents the normal vector perpendicular to the plane of the layers, $\rho_0$ is the isotropic longitudinal resistivity, and $\Delta\rho_{AMR}$ ($\Delta\rho_{UCMR}$) represents the size of the AMR (UCMR) effect.

Based on these correlations, the $\theta_{zy}$-dependence of MR, if any, was dominated by UCMR as the current (along x-axis) is always perpendicular to the magnetization direction during $\theta_{zy}$ sweeping. On the other hand, the $\theta_{zx}$-dependence of MR was mainly attributed to conventional AMR as y-component of magnetization is zero when the field is sufficiently strong to saturate the magnetization in the field-direction. Both AMR and UCMR contributed to the $\theta_{xy}$-dependence of MR. The small amplitude of MR ($\theta_{zx}$) shown in FIGS. 2C and 2D indicates that the MR shown in FIG. 2A was dominantly originated from UCMR. As shown in FIGS. 2C and 2D, the size of UCMR of the sample with a 1 nm Pt capping layer and without any Ta seed layer (0.061%) was comparable to that of the sample with both a 3 nm Pt capping and a 3 nm Ta seed layer (0.079%).

These results demonstrate that the observed UCMR was not just from the interfaces with Pt(3) and Ta(3); instead it should mainly come from the multilayer itself. Although both models based on spin-Hall magnetoresistance (SMR) (47) and spin-dependent scattering due to spin-orbit coupling (48) at the FM/HM interface could explain the observed UCMR, it is plausible that the SMR scenario was more relevant in the multilayer structures. In these samples, the individual Pt layers served as a source for both SHE and inverse SHE. The FeMn layer in-between served as a "spin-current valve", which controlled the relative amount of spin currents that could reach a specific Pt layer from the neighboring Pt layers. The reflected and transmitted spin-currents combined entering the specific Pt layer would determine the size of the UCMR. In the presence of both AMR and UCMR, the "W"-shaped MR curves in FIG. 2B indicates the competition between the two when there was a slight misalignment of the external field from the vertical direction.

FIGS. 2E and 2F show the dependence of planar Hall resistance (PHR) and anomalous Hall resistance (AHR) on magnetic field in the longitudinal and vertical direction, respectively, for the same samples whose MR curves are shown in FIGS. 2A and 2B. PHR and AHR were obtained by dividing the measured planar and anomalous Hall voltage by the current flowing only inside the multilayer instead of the total current. A positive current referred to the current following in positive x-direction and vice versa. The PHR and AHR each had a characteristic polar and azimuth angle dependence, i.e., PHR $\propto \sin 2\varphi$ and AHR $\propto \cos \theta$, respectively, where $\varphi$ is the angle between the magnetization and positive current direction and $\theta$ is the angle between the magnetization and the sample normal (27). The PHE signal shown in FIG. 2E resembles well the PHE curve of a typical FM with a small coercivity. These curves were essentially proportional to the first order derivatives of the MR curves shown in FIG. 2A.

On the other hand, the AHE signal increased linearly at low field and saturate at about ±2000 Oe, which correlated well with the out-of-plane M-H curve shown in FIG. 1A. The nearly linear increase of the AHE signal from −2000 Oe to 2000 Oe and clear saturation beyond this field range show that ferromagnetic order was developed throughout the multilayer structure, consistent with the magnetic measurement results described in EXAMPLE 1.

Example 3: Evaluation of Spin-Orbit Torque

Studies were conducted to evaluate the current-induced SOT in multilayer samples with and without an additional Pt capping layer as follows.

To reduce Joule heating, current sweeping experiments were performed using pulsed DC current with a constant duration (5 ms) and duty ratio (2.5%). To ensure good reproducibility, the experiments began with the sweeping from zero current and then gradually increased to a preset value in both positive and negative directions with a fixed step size. The Hall voltage was recorded using a nano-voltmeter from which PHR was obtained by dividing it with the peak value of pulsed current.

Figure 3:
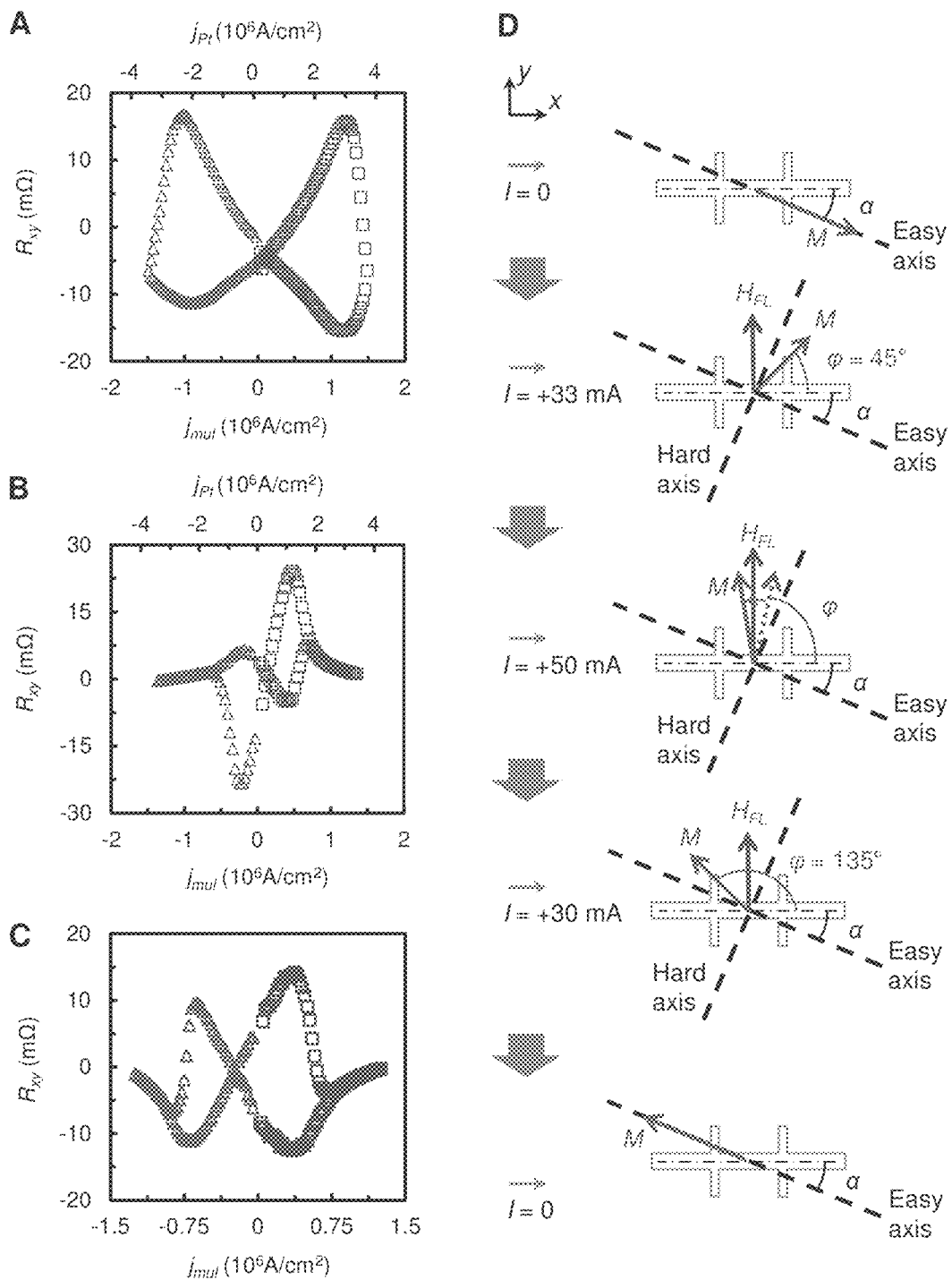
FIGS. 3A to 3D are a schematic depiction of current sweeping PHR curves 3A to 3C and illustration of magnetization reversal process 3D. 3A to 3C: PHR dependence on the pulsed current density for Pt(3)/[FeMn(0.6)/Pt(0.6)]$_6$/Ta(3)/SiO$_2$/Si 3A, Pt(3)/[FeMn(0.6)/Pt(0.6)]$_4$/Ta(3)/SiO$_2$/Si 3B, and Pt(1)/[FeMn(0.6)/Pt(0.6)]$_6$/SiO$_2$/Si 3C samples. Note that j$_{mul}$ represents the current density in the multilayer only, while j$_{Pt}$ represents the current density in the 3 nm Pt layer. 3D: Schematic illustration of the magnetization switching process assisted by anisotropy misalignment, where I represents the total current used in (A).

FIGS. 3A, 3B, and 3C show the PHRs as a function of current density for samples with structures of (A) Pt(3)/[FeMn(0.6)/Pt(0.6)]$_6$/Ta(3)/SiO$_2$/Si, (B) Pt(3)/[FeMn(0.6)/Pt(0.6)]$_4$/Ta(3)/SiO$_2$/Si, and (C) Pt(1)/[FeMn(0.6)/Pt(0.6)]$_6$/SiO$_2$/Si, respectively. Samples (A) and (B) both had a 3 nm Pt capping layer and a 3 nm Ta seed layer, whereas sample (C) only had a 1 nm Pt capping which is necessary to prevent the sample from oxidation. Due to the large resistivity of Ta as compared to Pt, current passes through the Ta layer could be ignored. To facilitate comparison with sample (C), FIGS. 3A and 3B show the current density in the multilayer in the lower horizontal axis and the current density in the Pt layer in the upper horizontal axis. The results shown in FIGS. 3A to 3C could be reproduced consistently. For the sake of clarity, the result from only one round of the measurement was shown, in which a pulsed current was firstly swept from 0 to a positive preset current (50 mA for (A), 40 mA for (B), and 20 mA for (C)), then to the negative preset current with the same peak value by passing zero, and finally back to zero. The overall shape of the PHR curve could be qualitatively explained when considering a field-like effective field ($H_{FL}$) induced in the $\vec{z} \times \vec{j}$ direction (27, 31, 49), as shown schematically in FIG. 3D (top-view of the Hall bar). The current shown in FIG. 3D was the actual current applied to obtain the switching curve shown in FIG. 3A. Due to the small uniaxial anisotropy, the effective easy axis at the junction of Hall bar was assumed to be at an angle $\alpha$ (e.g., −10°) away from the x-axis. When a current is applied in x-direction, an effective field $H_{FL}$ would be generated in y-direction with its strength proportional to the current. The competition between $H_{FL}$ and the effective anisotropy field ($H_k$) led to an in-plane rotation of the magnetization to towards y-direction with an angle $\varphi-\alpha$, where $\varphi$ is the angle between the magnetization and x-axis. The PHR reaches the first positive maximum when $\varphi=45°$. Further increase of the current would rotate the magnetization to a direction that is slightly passing over the y-axis towards the negative x-direction due to the added effect from $H_k$. When the current is gradually reduced after it reaches the positive preset value (50 mA in this case), the magnetization would continue to be rotated in anticlockwise direction and settle down in the opposite direction, i.e., $\varphi=180°+\alpha$, when the current returns to zero. During this quadrant of sweeping, a negative peak in PHR appeared when $\varphi=135°$. For the same reason, the magnetization would continue to be rotated in anticlockwise direction when the current is swept from zero to −50 mA and then back to zero. This took place as the effective field direction would be reversed when current changes sign. During this process, the PHR would first reach a positive maximum at $\varphi=225°$ and then a negative maximum at $\varphi=315°$. The magnetization would go back to the initial equilibrium direction after a full cycle of current sweeping.

The results shown in FIGS. 3A to 3C clearly demonstrate that the magnetization of the multilayer device could be switched from one direction to its opposite, and then back to its initial direction. Note that the reversible switching could be realized in a bare multilayer without an additional thick Pt layer, as shown in FIG. 3C.

Furthermore, the threshold current density was even smaller than that of the samples with an additional thick Pt layer (FIG. 3A). These results show that an effective field was induced inside the multilayer itself, regardless of whether there was an additional thick HM layer.

Figure 4:
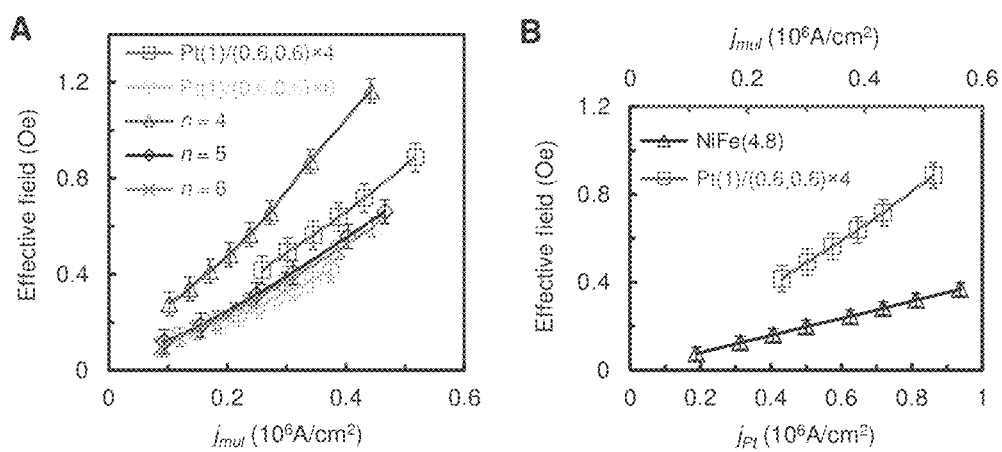
FIGS. 4A and 4B are a schematic depiction of H$_{FL}$ extracted by second order planar Hall effect (PHE) method. 4A: H$_{FL}$ for Batch B samples with n=4, 5 and 6, together with the Pt(1)/[FeMn(0.6)/Pt(0.6)]$_6$/SiO$_2$/Si and Pt(1)/[FeMn(0.6)/Pt(0.6)]$_4$/SiO$_2$/Si samples. Here, j$_{mul}$ is the current density in the multilayer portion of the samples. 4B: H$_{FL}$ for Pt(1)/[FeMn(0.6)/Pt(0.6)]$_4$/SiO$_2$/Si and Pt(3)/NiFe(4.8)/Ta(3)/SiO$_2$/Si samples. Note that j$_{Pt}$ is the current density inside the 3 nm Pt layer for Pt(3)/NiFe(4.8)/Ta(3)/SiO$_2$/Si.

Second order PHE measurements (27, 50) were then performed to quantify the strength of current-induced effective field $H_{FL}$ in different samples. FIG. 4A shows the $H_{FL}$ for Batch B samples with n=4, 5 and 6, together with that of the Pt(1)/[FeMn(0.6)/Pt(0.6)]$_6$ and Pt(1)/[FeMn(0.6)/Pt(0.6)]$_4$ samples, which were plotted against the current density in the multilayer portion of the samples ($j_{mul}$). It is worth noting that the effective fields of both Pt(1)/[FeMn (0.6)/Pt(0.6)]$_6$ and Pt(1)/[FeMn(0.6)/Pt(0.6)]$_4$ were comparable with the samples with a thick Pt capping layer, especially at low current density.

These results show that the effective field was mostly generated inside the multilayer itself; the effect of spin-current generated by the thick Pt layer is largely confined near its interface with the multilayer.

FIG. 4B shows the comparison of the effective field of Pt(1)/[FeMn(0.6)/Pt(0.6)]$_4$/SiO$_2$/Si with that of Pt(3)/NiFe (4.8)/Ta(3)/SiO$_2$/Si trilayer sample by plotting it against the current density in the multilayer itself for the former and that in Pt layer for the latter. The thickness of the multilayer (excluding the 1 nm Pt capping layer) was made the same as that of NiFe in the trilayer structure.

It was unexpectedly observed that, for the same current density, the effective field of the multilayer was about 4 times larger than that of the trilayer and the difference was even larger when taking into account only the current flowing through the Pt layers.

These results demonstrate that a magnetic system of this invention exhibited a high effective field without the need of additional Pt layers.

Example 4: Evaluation of Write and Read by Current

Studies were performed to evaluate the write and read by current in multilayer samples of this invention as follows.

Figure 5:
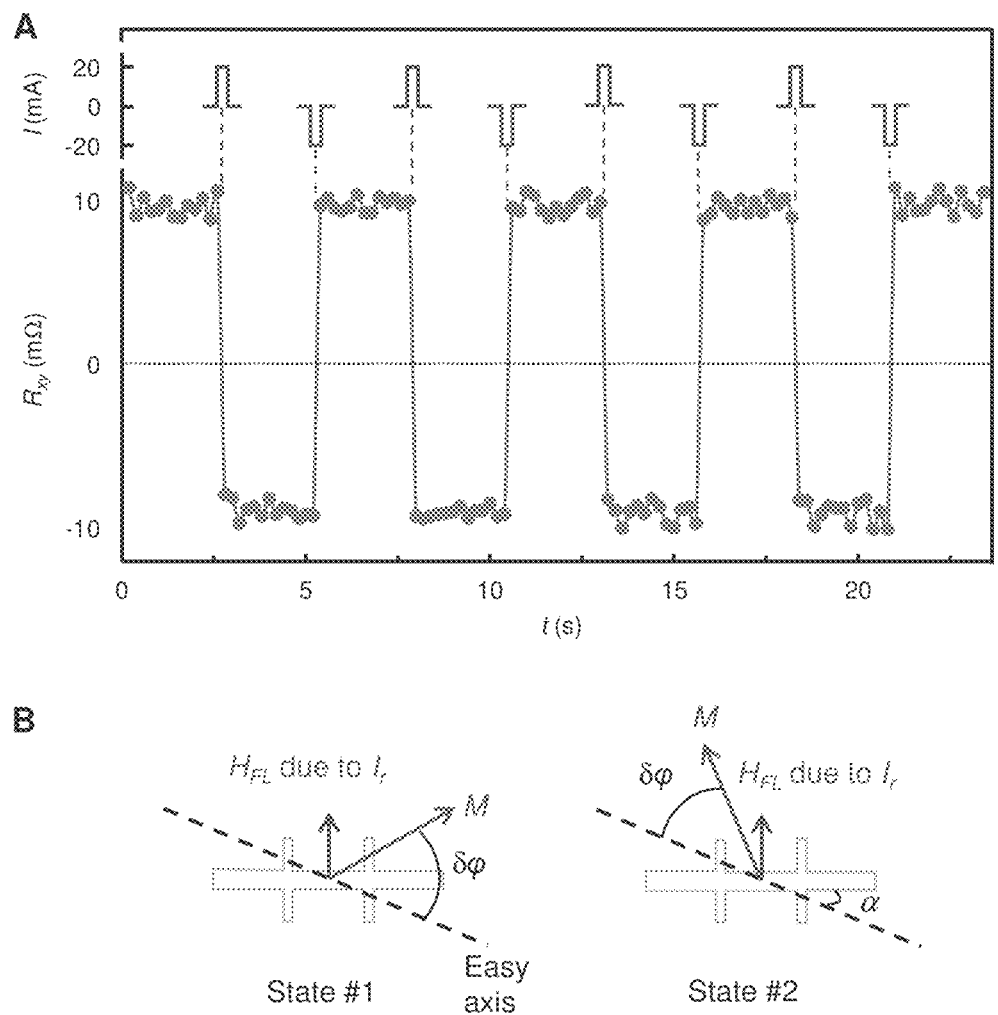
FIGS. 5A and 5B are a schematic depiction of write and read experiment. 5A: Illustration of write current pulses (20 mA with a duration of 5 ms) applied to the Pt(1)/[FeMn(0.6)/Pt(0.6)]$_6$ sample (upper panel) and readout signals in terms of PHR (lower panel). Reading is performed with a 2 mA pulse which is repeated 13 times after each writing process. 5B: Schematic illustration of magnetization rotation during reading at two states with opposite equilibrium magnetization directions.

To further demonstrate reversible magnetization switching of the multilayer, PHE measurements were performed on Pt(1)/[FeMn(0.6)/Pt(0.6)]$_6$ with alternate write and read pulse as shown schematically in the upper panel of FIG. 5A. The measurement began with the supply of a +20 mA (corresponding to a current density of 1.25×10$^6$ A/cm$^2$) write current pulse (I$_w$) with a duration of 5 ms to saturate the magnetization into a specific easy axis direction, followed by reading the Hall voltage with a 5 ms read current pulse (I$_r$) of +2 mA. The reading was repeated 13 times during which the PHR was recorded by dividing each measured Hall voltage with the 2 mA reading current, and the results are shown in the lower panel of FIG. 5A.

Subsequent to this, a negative current pulse of −20 mA was applied to reverse the magnetization and then read with the same 2 mA current pulse. The write and read cycles were repeated 8 times, as shown in FIG. 5A. The readout process could be readily analyzed in view of the schematic diagram shown in FIG. 5B.

During readout, the read current pulse (+2 mA) induces a small rotation of the magnetization (δφ) towards +y direction from its equilibrium positions, one at angle α (State #1) and the other at α+180° away from +x direction (State #2). When the read current is chosen properly for a specific a value, the magnetization will be rotated to the first octant for State #1 but remains in the second octant for State #2. This leads to Hall resistance of different polarity for the two states, positive for State #1 and negative for State #2. The absolute value of PHR depends on the readout current and misalignment angle α as shown clearly in FIGS. 3A to 3D. The results shown in both FIGS. 3A to 3D and FIGS. 5A and 5B demonstrate unambiguously reversible switching of magnetization solely by a current.

Although the physical origin of the field-like effective field in FM/HM hetero-structures is still debatable, recent studies suggest that its ratio to charge current density in the HM layer (j$_c$) could be written in the following form by taking into account only the spin current generated by SHE in the HM layer (51, 52):

$$H_{FL}/j_c = \frac{\hbar}{2e} \frac{\theta_{SH}}{\mu_0 M_s t_{FM}} \frac{g_i}{(1+g_r)^2 + g_i^2}\left(1 - \frac{1}{\cosh(d_{HM}/\lambda_{HM})}\right) \quad (2)$$

where θ$_{SH}$ is the spin Hall angle of HM, M$_s$ the saturation magnetization of FM, t$_{FM}$ the thickness of FM, h the reduced Planck constant, e the electron charge, μ$_0$ the vacuum permeability, d$_{HM}$ the thickness of HM, λ$_{HM}$ the spin diffusion length in HM, and g$_r$=Re[G$_{MIX}$]ρ$_{HM}$λ$_{HM}$coth(d$_{HM}$/λ$_{HM}$), g$_i$=Im[G$_{MIX}$]ρ$_{HM}$λ$_{HM}$coth(d$_{HM}$/λ$_{HM}$) with G$_{MIX}$ the spin mixing conductance of FM/HM interface and ρ$_{HM}$ the resistivity of HM. When using the parameters: μ$_0$M$_s$=0.52 T for NiFe (much smaller than the bulk value), θ$_{SH}$=0.2 (0.004-0.34 in literature), λ$_{HM}$=1.5 nm (0.5 nm-10 nm for Pt in literature), d$_{HM}$=3 nm, t$_{FM}$=4.8 nm, ρ$_{Pt}$=31.66 μΩ·cm (measured value), and G$_{MIX}$=(8.1×10$^{14}$+i 2.2×10$^{14}$) Ω$^{-1}$ m$^{-2}$ for NiFe/Pt (28, 53-55), it was found that the field-to-current ratio H$_{FL}$/j$_c$=1.34×10$^{-7}$ Oe/(A/cm$^2$). This was comparable to the experimental value of 2.93×10$^{-7}$ Oe/(A/m$^2$) for the Pt(3)/NiFe(4.8)/Ta(3) sample shown in FIG. 4B. On the other hand, when using d$_{HM}$=1 nm and keeping other parameters the same, the effective field to current ratio decreased to 4.0×10$^{-8}$ Oe/(A/m$^2$). In other words, when replacing NiFe by the multilayer, the spin current from the 1 nm Pt capping layer alone would be too small to account for the effective field obtained experimentally.

The observation of clear SMR suggests that spin current was present inside the Pt(1)/[FeMn(0.6)/Pt(0.6)]$_6$ multilayer. Considering the fact that FeMn has a very small spin Hall angle (56), it could be assumed that the spin current was dominantly from the Pt layers. Since both the Pt and FeMn layers were very thin, the entire multilayer was considered as a ferromagnet with a large spin Hall angle. When a charge current was applied to the multilayer in x-direction, the SHE generated a spin current flowing in z-direction with the spin polarization in y-direction, thereby building up spin accumulations at both the top and bottom surfaces. At steady state and under the boundary conditions, j$_{sy}^z$(0)=j$_{sy}^z$(d)=0, the spin current is given by $$j_{sy}^z(z) = j_{s0}^{SH}\left[\sinh\frac{z}{\lambda} - \sinh\frac{z-d}{\lambda}\right]/\sinh\frac{d}{\lambda} - j_{s0}^{SH} \quad (3)$$

where j$_{s0}^{SH}$ is the SHE spin current, λ is the average spin diffusion length and d thickness of the multilayer stack. In the strict sense, Eq. (3) is valid only for a pure paramagnet like Pt. In the current case, in addition to Pt, FeMn layers and the entire multilayer could be ferromagnets. Therefore, the SHE spin current would be partially absorbed and converted to SOT. The absorption is strongest when the polarization of spin current is perpendicular to the magnetization direction and smallest when they are parallel, thereby inducing the SMR-like magnetoresistance. It should be pointed out that in the latter case, spin current can travel through the multilayer because it behaves like a single phase FM, which is different from a FM/HM bilayer. In the extreme case, it could be assumed that the spin current generated by the Pt layers is completely absorbed by the FeMn layers locally when the polarization of spin current is perpendicular to the local magnetization direction. Under this assumption, there would be no spin accumulation at the two surfaces. The difference in spin current between these two cases gives the SMR-like MR as follows:

$$\frac{\Delta R_{xx}}{R_{xx}} = \frac{2\lambda\eta\theta_{SH}^2}{d}\left(\cosh\frac{d}{\lambda} - 1\right)/\sinh\frac{d}{\lambda} \quad (4)$$

Here, η<1 describes the efficiency of spin current absorption in realistic situations. When using the following parameters: η=0.5, λ=1.5 nm, d=8.2 nm (total thickness of Pt(1)/[FeMn(0.6)/Pt(0.6)]$_6$), and $$\frac{\Delta R}{R_{xx}} = 0.0610\%$$

(experimental value extracted from FIG. 2D), it was found that a spin Hall angle θ$_{SH}$=0.058 for this sample. With this spin Hall angle, the damping-like effective field to current ratio is calculated as $$H_{DL}/j_c = \frac{\hbar}{2e}\frac{2\eta\theta_{SH}\lambda}{d\mu_0 M_s t_{FeMn}}\left(\cosh\frac{d}{\lambda} - 1\right)/\sinh\frac{d}{\lambda} \quad (5)$$

When using the following parameters: $\mu_0 M_s$=0.32 T (experimental value), $t_{FeMn}$=3.6 nm (total thickness of FeMn), and $\theta_{SH}$=0.058, it was found that $H_{DL}/j_c$=3.78×10$^{-7}$ Oe/(A/cm$^2$). Although it was 2-3 times smaller than the experimentally observed value of $H_{FL}/j_c$, it indicated that the field-like and damping-like effective fields were typically on the same order in FM/HM bilayers (19, 50, 57, 58).

In sum, both ferromagnetic properties and SOT were unexpectedly observed in FeMn/Pt layer arrays consisting of ultrathin Pt and FeMn layers. The former was characterized by a 3D Heisenberg critical behavior with a finite distribution in $T_C$. The self-current induced SOT was capable of inducing reversible switching of magnetization without the need of an external field or additional Pt layer.

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

Further, from the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

REFERENCES

1. S. Ganichev et al., Spin-galvanic effect. Nature 417, 153 (2002).
2. A. Manchon, S. Zhang, Theory of nonequilibrium intrinsic spin torque in a single nanomagnet. Physical Review B 78, 212405 (2008).
3. A. Chernyshov et al., Evidence for reversible control of magnetization in a ferromagnetic material by means of spin-orbit magnetic field. Nat. Phys. 5, 656 (2009).
4. I. M. Miron et al., Current-driven spin torque induced by the Rashba effect in a ferromagnetic metal layer. Nature materials 9, 230 (2010).
5. A. Manchon, H. Koo, J. Nitta, S. Frolov, R. Duine, New perspectives for Rashba spin-orbit coupling. Nature materials 14, 871 (2015).
6. N. Locatelli, V. Cros, J. Grollier, Spin-torque building blocks. Nature materials 13, 11 (2014).
7. A. Brataas, A. D. Kent, H. Ohno, Current-induced torques in magnetic materials. Nature materials 11, 372 (2012).
8. H. Kurebayashi et al., An antidamping spin-orbit torque originating from the Berry curvature. Nature nanotechnology 9, 211 (2014).
9. T. Suzuki et al., Current-induced effective field in perpendicularly magnetized Ta/CoFeB/MgO wire. Applied Physics Letters 98, 142505 (2011).
10. I. M. Miron et al., Perpendicular switching of a single ferromagnetic layer induced by in-plane current injection. Nature 476, 189 (2011).
11. L. Liu et al., Spin-torque switching with the giant spin Hall effect of tantalum. Science 336, 555 (2012).
12. X. Fan et al., Observation of the nonlocal spin-orbital effective field. Nature communications 4, 1799 (2013).
13. K. Garello et al., Symmetry and magnitude of spin-orbit torques in ferromagnetic heterostructures. Nature nanotechnology 8, 587 (2013).
14. G. Yu et al., Switching of perpendicular magnetization by spin-orbit torques in the absence of external magnetic fields. Nature nanotechnology 9, 548 (2014).
15. J. Kim et al., Layer thickness dependence of the current-induced effective field vector in Ta| CoFeB|MgO. Nature materials 12, 240 (2013).
16. J. Wunderlich, B. Kaestner, J. Sinova, T. Jungwirth, Experimental observation of the spin-Hall effect in a two-dimensional spin-orbit coupled semiconductor system. Physical review letters 94, 047204 (2005).
17. V. Sih et al., Spatial imaging of the spin Hall effect and current-induced polarization in two-dimensional electron gases. Nature Physics 1, 31 (2005).
18. S. O. Valenzuela, M. Tinkham, Direct electronic measurement of the spin Hall effect. Nature 442, 176 (2006).
19. K. Garello et al., Symmetry and magnitude of spin-orbit torques in ferromagnetic heterostructures. Nat. Nanotechnol. 8, 587 (August, 2013).
20. C. O. Avci et al., Fieldlike and antidamping spin-orbit torques in as-grown and annealed Ta/CoFeB/MgO layers. Phys. Rev. B 89, (2014).
21. G. Yu et al., Switching of perpendicular magnetization by spin-orbit torques in the absence of external magnetic fields. Nat. Nanotechnol. 9, 548 (July, 2014).
22. C.-F. Pal et al., Spin transfer torque devices utilizing the giant spin Hall effect of tungsten. Appl. Phys. Lett. 101, 122404 (2012).
23. X. Qiu et al., Spin-orbit-torque engineering via oxygen manipulation. Nature nanotechnology 10, 333 (2015).
24. K.-S. Ryu, L. Thomas, S.-H. Yang, S. Parkin, Chiral spin torque at magnetic domain walls. Nature nanotechnology 8, 527 (2013).
25. C. Nistor et al., Orbital moment anisotropy of Pt/Co/AlO x heterostructures with strong Rashba interaction. Physical Review B 84, 054464 (2011).
26. I. M. Miron et al., Fast current-induced domain-wall motion controlled by the Rashba effect. Nature Materials 10, 419 (2011).
27. X. Fan et al., Observation of the nonlocal spin-orbital effective field. Nat. commun. 4, 1799 (2013).
28. T. Nan et al., Comparison of spin-orbit torques and spin pumping across NiFe/Pt and NiFe/Cu/Pt interfaces. Physical Review B 91, 214416 (2015).
29. I. M. Miron et al., Current-driven spin torque induced by the Rashba effect in a ferromagnetic metal layer. Nat. Mater. 9, 230 (March, 2010).
30. I. M. Miron et al., Perpendicular switching of a single ferromagnetic layer induced by in-plane current injection. Nature 476, 189 (Aug. 11, 2011).
31. L. Liu, O. J. Lee, T. J. Gudmundsen, D. C. Ralph, R. A. Buhrman, Current-Induced Switching of Perpendicularly Magnetized Magnetic Layers Using Spin Torque from the Spin Hall Effect. Phys. Rev. Lett. 109, (2012).
32. M. Jamali et al., Spin-Orbit Torques in Co/Pd Multilayer Nanowires. Phys. Rev. Lett. 111, (2013).
33. Y. Yang et al., in Magnetics Conference (INTERMAG), 2015 IEEE. (IEEE, 2015), pp. 1-1.
34. Y. Liu et al., Configuration of the uncompensated moments at the FM/AFM interface with a NM spacer. J. Phys. D: Appl. Phys. 41, 205006 (2008).
35. T. McGuire, J. Aboaf, E. Klokholm, Magnetic and transport properties of Co—Pt thin films. J. Appl. Phys. 55, 1951 (1984).
36. S. Rüegg et al., Spin-dependent x-ray absorption in Co/Pt multilayers. J. Appl. Phys. 69, 5655 (1991).
37. C.-J. Lin et al., Magnetic and structural properties of Co/Pt multilayers. J. Magn. Magn. Mater. 93, 194 (1991).

38. P. Poulopoulos et al., Magnetic properties of Co-based multilayers with layer-alloyed modulations. J. Magn. Magn. Mater. 148, 78 (1995).
39. S. Emori, G. S. Beach, Optimization of out-of-plane magnetized Co/Pt multilayers with resistive buffer layers. J. Appl. Phys. 110, 033919 (2011).
40. P. Jensen, H. Dreyssé, K. Bennemann, Calculation of the film-thickness-dependence of the Curie temperature in thin transition metal films. Europhys. Lett. 18, 463 (1992).
41. R. Zhang, R. F. Willis, Thickness-dependent Curie temperatures of ultrathin magnetic films: effect of the range of spin-spin interactions. Phys. Rev. Lett. 86, 2665 (2001).
42. M. Kuz'min, Shape of temperature dependence of spontaneous magnetization of ferromagnets: quantitative analysis. Phys. Rev. Lett. 94, 107204 (2005).
43. K. Namikawa, LEED Investigation on Temperature Dependence of Sublattice Magnetization of NiO (001) Surface Layers. J. Phys. Soc. Jpn. 44, 165 (1978).
44. S. Alvarado, M. Campagna, H. Hopster, Surface magnetism of Ni (100) near the critical region by spin-polarized electron scattering. Phys. Rev. Lett. 48, 51 (1982).
45. J. Voigt et al., Magnetic hyperfine field at In 111 probes in the topmost atomic layer of Ni (111) surfaces. Phys. Rev. Lett. 64, 2202 (1990).
46. M. Krech, Surface scaling behavior of isotropic Heisenberg systems: Critical exponents, structure factor, and profiles. Phys. Rev. B 62, 6360 (2000).
47. H. Nakayama et al., Spin Hall magnetoresistance induced by a nonequilibrium proximity effect. Phys. Rev. Lett. 110, 206601 (2013).
48. S. S. L. Zhang, G. Vignale, S. Zhang, Anisotropic magnetoresistance driven by surface spin-orbit scattering. Phys. Rev. B 92, 024412 (Jul. 13, 2015).
49. H. Li et al., Intraband and interband spin-orbit torques in noncentrosymmetric ferromagnets. Phys. Rev. B 91, (2015).
50. X. Fan et al., Quantifying interface and bulk contributions to spin-orbit torque in magnetic bilayers. Nat. commun. 5, 3042 (2014).
51. Y.-T. Chen et al., Theory of spin Hall magnetoresistance. Phys. Rev. B 87, 144411 (2013).
52. J. Kim et al., Anomalous temperature dependence of current-induced torques in CoFeB/MgO heterostructures with Ta-based underlayers. Phys. Rev. B 89, 174424 (May 23, 2014).
53. M. Weiler et al., Experimental test of the spin mixing interface conductivity concept. Phys. Rev. Lett. 111, 176601 (2013).
54. M. Althammer et al., Quantitative study of the spin Hall magnetoresistance in ferromagnetic insulator/normal metal hybrids. Phys. Rev. B 87, 224401 (2013).
55. N. Vlietstra et al., Exchange magnetic field torques in YIG/Pt bilayers observed by the spin-Hall magnetoresistance. Appl. Phys. Lett. 103, 032401 (2013).
56. W. Zhang et al., Spin Hall Effects in Metallic Antiferromagnets. Phys. Rev. Lett. 113, 196602 (Nov. 4, 2014).
57. J. Kim et al., Layer thickness dependence of the current-induced effective field vector in Ta|CoFeB|MgO. Nat. Mater. 12, 240 (03//print, 2013).
58. K. Masashi et al., Current-Induced Effective Fields Detected by Magnetotrasport Measurements. Appl. Phys. Express 6, 113002 (2013).

What is claimed is:

1. A magnetic system comprising a plurality of layer arrays that are in a stacked arrangement, each layer array containing:
   (a) only two layers, the two layers being a first anti-ferromagnetic (AFM1) layer and a heavy metal (HM) layer formed of a material having strong spin-orbit coupling, wherein the AFM1 layer has a thickness of 0.1 to 1.0 nm, the HM layer has a thickness of 0.1 to 1.2 nm, and the HM layer is disposed directly on the AFM1 layer;
   or
   (b) only three layers, the three layers being an AFM1 layer, an HM layer formed of a material having strong spin-orbit coupling, and a second anti-ferromagnetic (AFM2) layer, wherein the AFM1 and the AFM2 layer each have a thickness of 0.1 to 1.0 nm, the HM layer has a thickness of 0.1 to 1.2 nm, the HM layer is disposed directly on the AFM1 layer or the AFM2 layer, and the top-to-bottom order of the three layers disposed directly on each other is AFM1-HM-AFM2 or AFM2-HM-AFM1;
   or
   (c) only three layers, the three layers being an AFM1 layer, an HM layer formed of a material having strong spin-orbit coupling, and a ferromagnetic (FM) layer, wherein the AFM1 layer and the FM layer each have a thickness of 0.1 to 1.0 nm, the HM layer has a thickness of 0.1 to 1.2 nm, and the HM layer is disposed directly on the AFM1 layer or the FM layer, and the top-to-bottom order of the three layers disposed directly on each other is AFM1-HM-FM or FM-HM-AFM1,
   whereby, for each of (a), (b), and (c), the magnetic system, formed by repeatedly stacking the layer arrays until a pre-determined total thickness is achieved, exhibits ferromagnetic property above room temperature and spin-orbit torque (SOT) in the presence of an in-plane current, said SOT capable of switching magnetization of the system in the absence of an external magnetic field.

2. The magnetic system of claim 1, further comprising a capping layer, a seed layer, or both, wherein the capping layer and the seed layer are respectively disposed at the top and the bottom of the plurality of layer arrays.

3. The magnetic system of claim 1, wherein each layer array contains only three layers, the three layers being the AFM1 layer, the HM layer, and the FM layer, in which the AFM1 layer is formed of FeMn, IrMn, PtMn, NiMn, PtNiMn, NiO, CoO, NiFe, Mn, or Cr; the HM layer is formed of Pt, Pd, Ta, or W; and the FM layer is formed of Co, Fe, Ni, Gd, CoFeB, or an alloy thereof.

4. The magnetic system of claim 1, wherein each layer array contains only three layers, the three layers being the AFM1 layer, the HM layer, and the AFM2 layer, in which the AFM1 layer and the AFM2 layer, being different from each other, are each formed of FeMn, IrMn, PtMn, NiMn, PtNiMn, NiO, CoO, NiFe, Mn, or Cr; and the HM layer is formed of Pt, Pd, Ta, or W.

5. The magnetic system of claim 1, wherein the AFM1 layer is formed of FeMn or NiFe, the HM layer is formed of Pt or Pd, the FM layer is formed of Co or Ni, the AFM1 layer and the FM layer each have a thickness of 0.2 to 1.0 nm, and the HM layer has a thickness of 0.2 to 0.8 nm.

6. The magnetic system of claim 1, wherein the AFM1 layer and the AFM2 layer are each formed of FeMn, IrMn, PtMn, NiMn, PtNiMn, or NiFe; the HM layer is formed of Pt or Pd; the AFM1 layer and the AFM2 layer each have a thickness of 0.2 to 1.0 nm; and the HM layer has a thickness of 0.2 to 0.8 nm.

7. The magnetic system of claim 1, wherein each layer array contains only two layers, the two layers being the AFM1 layer and the HM layer, in which the AFM1 layer is formed of FeMn, IrMn, PtMn, NiMn, PtNiMn, NiO, CoO, NiFe, Mn, or Cr; and the HM layer is formed of Pt, Pd, Ta, or W.

8. The magnetic system of claim 7, wherein the AFM1 layer is formed of FeMn or NiFe and the HM layer is formed of Pt.

9. The magnetic system of claim 7, wherein the AFM1 layer has a thickness of 0.2 to 1.0 nm and the HM layer has a thickness of 0.2 to 0.8 nm.

10. The magnetic system of claim 9, wherein the AFM1 layer is formed of FeMn or NiFe and the HM layer is formed of Pt.

\* \* \* \* \*